US008552532B2

(12) United States Patent
Clark, Jr. et al.

(10) Patent No.: US 8,552,532 B2
(45) Date of Patent: Oct. 8, 2013

(54) SELF ALIGNED STRUCTURES AND DESIGN STRUCTURE THEREOF

(75) Inventors: William F. Clark, Jr., Essex Junction, VT (US); John J. Pekarik, Underhill, VT (US); Yun Shi, South Burlington, VT (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/343,287

(22) Filed: Jan. 4, 2012

(65) Prior Publication Data
US 2013/0168822 A1    Jul. 4, 2013

(51) Int. Cl.
*H01L 29/1004* (2006.01)
(52) U.S. Cl.
USPC .......................................... 257/592; 257/565
(58) Field of Classification Search
USPC ........................................................ 257/592
See application file for complete search history.

(56) References Cited

U.S. PATENT DOCUMENTS

| 5,430,318 | A | 7/1995 | Hsu |
| 6,329,675 | B2 | 12/2001 | Singh et al. |
| 6,579,771 | B1 * | 6/2003 | Ahmed et al. ................ 438/322 |
| 6,828,635 | B2 | 12/2004 | Panday et al. |
| 6,905,935 | B1 | 6/2005 | Gau et al. |
| 6,989,557 | B2 * | 1/2006 | Chen ............................ 257/197 |
| 7,160,753 | B2 | 1/2007 | Williams, Jr. |
| 7,579,252 | B2 | 8/2009 | Goulakov |
| 7,937,675 | B2 * | 5/2011 | Anderson et al. ............... 716/55 |
| 2007/0102789 | A1 * | 5/2007 | Bryant et al. ................ 257/565 |
| 2007/0224784 | A1 * | 9/2007 | Soloviev et al. ............. 438/478 |
| 2008/0280414 | A1 | 11/2008 | Zaman |
| 2009/0315111 | A1 * | 12/2009 | Yamazaki et al. ............ 257/354 |
| 2010/0006816 | A1 | 1/2010 | Magistretti et al. |
| 2010/0213575 | A1 | 8/2010 | Chen et al. |
| 2012/0168907 | A1 * | 7/2012 | Malladi et al. ................ 257/565 |

FOREIGN PATENT DOCUMENTS

CN    101692424    4/2010

OTHER PUBLICATIONS

P. Pengpad et al. "Double-polysilicon self-aligned lateral bipolar transistors", Electronics & Computer Science, University of Southampton, 2007, pp. 183-187.

* cited by examiner

*Primary Examiner* — Telly Green
*Assistant Examiner* — Damian A Hillman
(74) *Attorney, Agent, or Firm* — Anthony Canale; Roberts Mlotkowski Safan & Cole, P.C.

(57) ABSTRACT

Vertical bipolar junction structures, methods of manufacture and design structures. The method includes forming one or more sacrificial structures for a bipolar junction transistor (BJT) in a first region of a chip. The method includes forming a mask over the one or more sacrificial structures. The method further includes etching an opening in the mask, aligned with the one or more sacrificial structures. The method includes forming a trench through the opening and extending into diffusion regions below the one or more sacrificial structures. The method includes forming a base region of the BJT by depositing an epitaxial material in the trench, in contact with the diffusion regions. The method includes forming an emitter contact by depositing a second epitaxial material on the base region within the trench. The epitaxial material for the emitter region is of an opposite dopant type than the epitaxial material of the base region.

17 Claims, 4 Drawing Sheets

SELF ALIGNED STRUCTURES AND DESIGN STRUCTURE THEREOF

FIELD OF THE INVENTION

The invention relates to semiconductor structures and, more particularly, to self-aligned vertical bipolar junction (BJT) structures, methods of manufacture and design structures.

BACKGROUND

A bipolar junction transistor (BJT) is a three-terminal electronic device constructed of doped semiconductor material and may be used in amplifying or switching applications. Charge flow in a BJT is due to bidirectional diffusion of charge carriers across a junction between two regions of different charge concentrations. This mode of operation is contrasted with unipolar transistors, such as field-effect transistors, in which only one carrier type is involved in charge flow due to drift. By design, most of the BJT collector current is due to the flow of charges injected from a high-concentration emitter into the base where they are minority carriers that diffuse toward the collector. For this reason, BJTs are classified as minority-carrier devices.

The BJT continues to be a valuable device in scaled technologies as designs converge to higher levels of system on chip (SOC) integration. As the technologies scale geometrically it becomes increasing important to provide high performance BJTs with minimum disruption to the main flow, which is further complicated by the addition of advanced technology elements like silicon on insulator (SOI) and high-K metal gates.

Accordingly, there exists a need in the art to overcome the deficiencies and limitations described hereinabove.

SUMMARY

In an aspect of the invention, a method comprises forming one or more sacrificial structures for a bipolar junction transistor (BJT) in a first region of a chip, over respective diffusion regions. The method further comprises forming a mask over the one or more sacrificial structures. The method further comprises etching an opening in the mask, aligned with the one or more sacrificial structures. The method further comprises forming a trench through the opening and extending into diffusion regions below the one or more sacrificial structures. The method further comprises forming a base region of the BJT by depositing an epitaxial material in the trench, in contact with the diffusion regions. The method further comprises forming an emitter contact of the BJT by depositing a second epitaxial material on the base region within the trench. The epitaxial material for the emitter region is of an opposite dopant type than the epitaxial material of the base region.

In another aspect of the invention, a structure comprises a vertically aligned bipolar junction transistor (BJT) comprising at least one diffusion region of a first dopant type, and a base region and emitter region formed in a single trench structure aligned with the at least one diffusion region. The base region and the emitter region are of different dopant types and have a same cross sectional dimension in vertical alignment with one another.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a self-aligned vertical bipolar junction (BJT) structure, which comprises the structures of the present invention. In still further embodiments, a method in a computer-aided design system is provided for generating a functional design model of the self-aligned vertical bipolar junction (BJT) structure.

In embodiments, a method in a computer-aided design system for generating a functional design model of a self-aligned vertical bipolar junction (BJT) structure is provided. The method comprises: generating a functional representation of a vertically aligned bipolar junction transistor (BJT) comprising at least one diffusion region of a first dopant type, and a base region and emitter region formed in a single trench structure aligned with the at least one diffusion region. The base region and the emitter region are of different dopant types and have a same cross sectional dimension in vertical alignment with one another.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and, more particularly, to self-aligned vertical bipolar junction (BJT) structures, methods of manufacture and design structures. More specifically, the present invention relates to structures and methods of fabricating a BJT with a vertically self-aligned emitter and base, in a gate last high-k dielectric metal gate replacement flow; although a gate first process is also contemplated by the present invention. Advantageously, the self-alignment of the emitter and base provides for lower parasitic capacitance and higher areal density of the BJT. The BJT can be fabricated using an ultra-thin silicon on insulator (SOI) substrate with a dual-BOX structure; although, the present invention is equally applicable to a single buried oxide (BOX) SOI structure using conventional junction isolation in the substrate with an arbitrary BOX film thickness or ultra-thin or normal SOI thickness structures.

Figure 1:
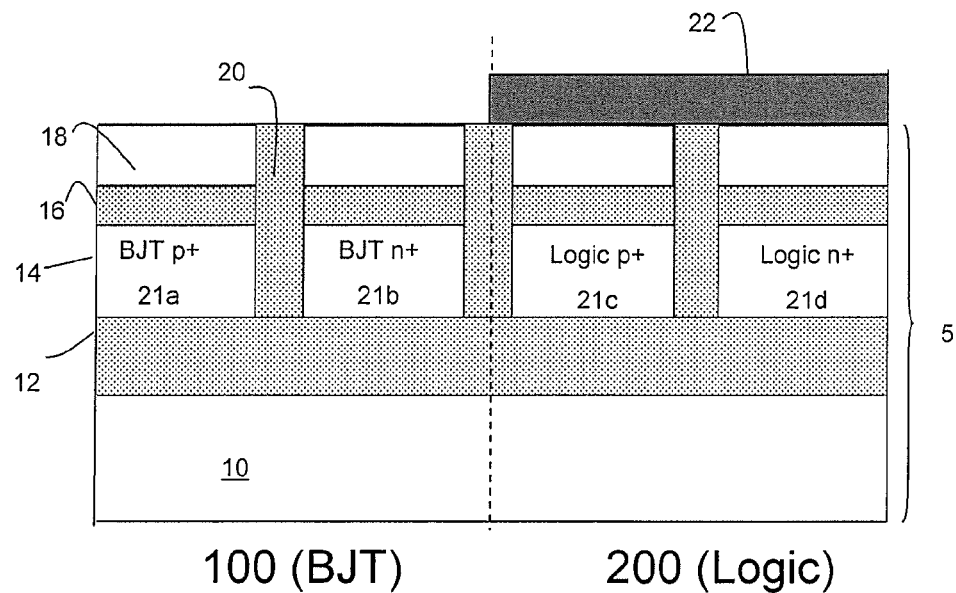
FIGS. 1-5 show structures and respective processing steps in accordance with aspects of the present invention.

FIG. 1 shows a structure and respective processing steps in accordance with aspects of the present invention. More specifically, FIG. 1 shows a dual-BOX structure 5 with a thin SOI layer. As shown in FIG. 1, the dual-BOX structure 5 includes a BJT region 100 and logic region 200. As should be understood by those of skill in the art, the SOI substrate 5 can be fabricated using any conventional technique such as, for example, wafer bonding or SiMOX processes. Also, although the present invention is described with reference to a dual-BOX structure 5, it should be understood by those of skill in the art that the present invention can also be implemented in a single BOX SOI structure using conventional junction isolation in the substrate.

More specifically, the dual-BOX structure 5 includes an oxide layer 12 (also known as a BOX) bonded to an Si handling wafer 10. In embodiments, the Si handling wafer 10 is a p-substrate. An Si based material 14 is formed on the BOX layer 12. A second BOX layer 16 is formed on the Si based material 14. The second BOX layer 16 can be about 20 nm to 30 nm in thickness; although other dimensions are also contemplated by the present invention. A thin Si based material 18 is formed on the second BOX layer 16. In embodiments, the thin Si based material 18 can be about 6 nm in thickness; although other dimensions are also contemplated by the present invention.

One or more STI structures 20 are formed in the structure, separating diffusion regions, e.g., n+ and p+ regions 21a, 21b, 21c, 21d, of both the BJT region 100 and logic region 200. In embodiments, the STI structures 20 reach through the Si based material 14, second BOX layer 16 and thin Si based material 18. The STI structures 20 can be formed using conventional photolithographic, etching and deposition processes. For example, a mask can be formed on the thin Si based material 18, and exposed to energy to form a pattern (openings). A conventional etching process, e.g., reactive ion etching (RIE), can then be used to form trenches, extending to the BOX layer 12. An oxide can then be deposited within the trenches using a conventional deposition process, e.g., chemical vapor deposition (CVD), atomic layer deposition (ALD), etc.

In embodiments, any combination of n+ and p+ regions, 21a, 21b, can be used with the BJT region 100, depending on the type of vertical structure. For example, the BJT region 100 can be all n+ regions, all p+ regions or any combination thereof, to form npn or pnp structures. Moreover, it should be understood by those of ordinary skill in the art that n+ and p+ regions for the BJT region 100 can be formed in separate high dose implantation processes, separate or together with the respective n+ and p+ regions for the logic region 200, using a mask (as represented by mask 22). By forming the diffusions for the BJT region 100 separate from the logic region 200, it is possible to tailor the implants, e.g., n+ and p+ regions 21a, 21b, for the BJT region 100 and logic region 200. As illustrative examples of different processing combinations:

(i) all regions 21c, 21d in the logic region 200 and the n+ regions 21b in the BJT region 100 can be masked, while the p+ regions 21a are doped with an appropriate dopant known to those of skill in the art;

(ii) all regions 21c, 21d in the logic region 200 and the p+ regions 21a in the BJT region 100 can be masked, while the n+ regions 21b are doped with an appropriate dopant known to those of skill in the art;

(iii) all n+ regions 21b, 21d can be masked, while the p+ regions 21a, 21c are doped with an appropriate dopant known to those of skill in the art; and/or (iv) all p+ regions 21a, 21c can be masked, while the n+ regions 21b, 21d are doped with an appropriate dopant known to those of skill in the art.

Figure 2:
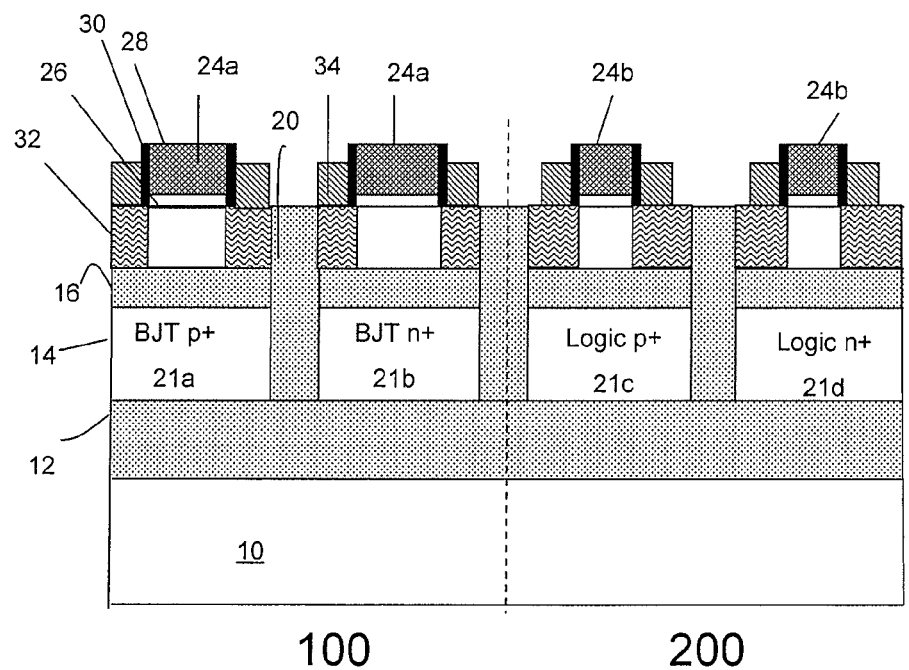

In FIG. 2, sacrificial structures 24a are formed for the BJT region 100, and sacrificial gate structures 24b (or gate structures in a gate first process) are formed for the logic region 200. In embodiments, the gate structures 24b are sized to be node dependent; that is, the dimensions of the gate structures 24b are dependent on the technology node. In an illustrative example, the dimensions of the gate structures 24b can be about 30 nm. On the other hand, the sacrificial structures can be larger (e.g., having a decreased aspect ratio) than the technology node, in order to accommodate additional processing, as described herein. In embodiments, the sacrificial structures 24a can be, for example, about 50 nm to about 100 nm, in width.

In embodiments, the processes of the present invention can use a gate first process or a gate last process. In a gate last process, for example, sacrificial structures 24a and sacrificial gate structures 24b can be formed in the same processing steps or in different processing steps. For example, an insulator layer 26, e.g., sacrificial oxide, can be deposited on the layer 18 using conventional deposition methods such as CVD. A sacrificial poly material 28 can be deposited on the insulator layer 26. The insulator layer 26 and the poly material 28 are then patterned to form the sacrificial structures 24a and sacrificial gate structures 24b. The patterning is performed by conventional CMOS processes, i.e., photolithographic and etching. Sidewall spacers 30 are then formed on the sidewalls of the sacrificial structures 24a and sacrificial gate structures 24b. The sidewall spacers 30 can be oxide, for example, deposited or grown, using conventional processes. In embodiments, the sidewall spacers 30 can also be nitride.

Still referring to FIG. 2, source and drain regions 32 are formed using conventional dopants and processes, such that further explanation is not required herein for an understanding of the invention. For clarity, as should be understood by those of skill in the art, the n-type devices will be doped with a dopant which is a different dopant for the p-type devices, during different processes, using a mask. In alternate embodiments, the source and drain regions 32 can be formed by diffusions from a raised epitaxial layer 34, which can be grown on the Si layer 18. In embodiments, the raised epitaxial layer 34 on the sides of the sacrificial structures 24a will act as a BJT base contact.

Figure 3:
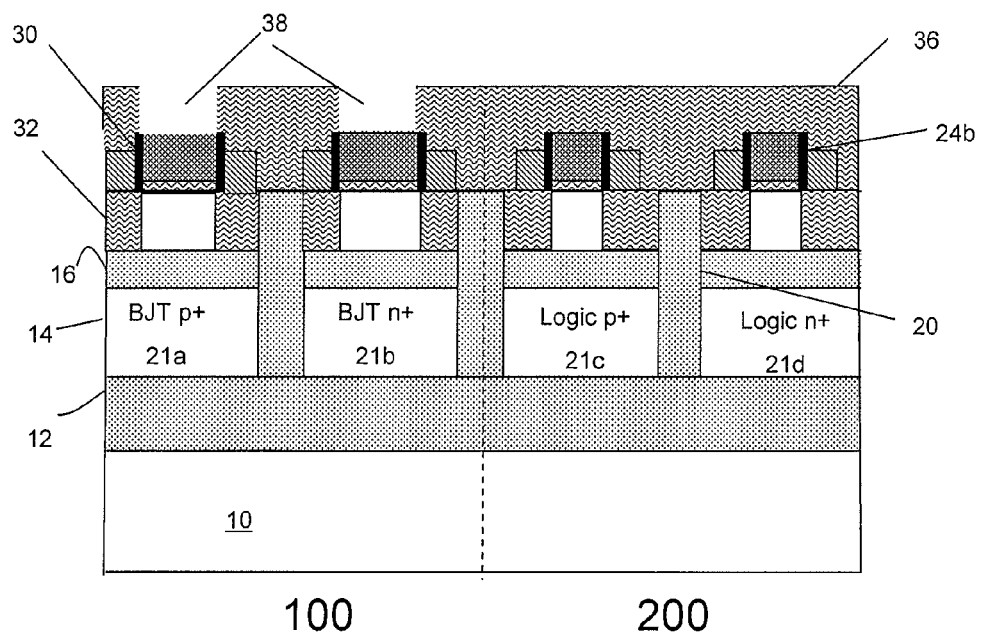

In FIG. 3, a mask 36 is formed over the sacrificial structures 24a and gate structures 24b (e.g., sacrificial gate structures). A trench or via 38 is opened in the mask 36, aligned with the material 28 of the sacrificial structures 24a. More specifically, the trench or via 38 is aligned with the sacrificial structures 24a, and more preferably exposing the material 28 between the sidewall spacers 30.

Figure 4:
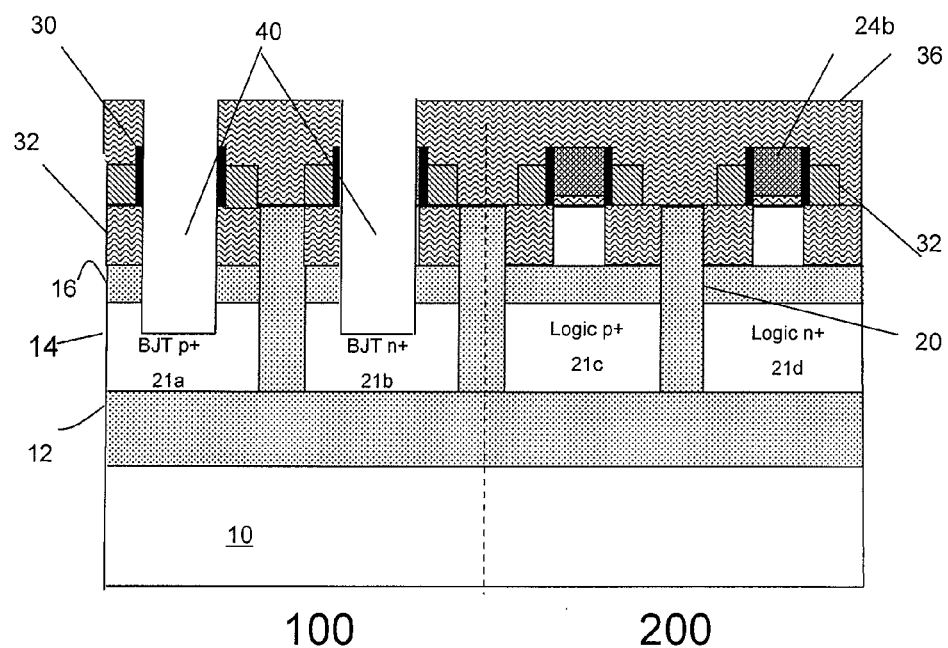

FIG. 4 shows respective processing steps and related structure in accordance with further aspects of the present invention. More specifically, FIG. 4 shows the formation of a deep trench 40, aligned with the trench or via 38. In embodiments, the deep trench 40 is formed by a conventional etching process such as a RIE. The deep trench 40 removes the material 28 and insulator layer 30, and extends into the BJT regions 21a, 21b. In embodiments, the deep trench 40 thus etches through several materials, i.e., materials 14, 16, 18, 26 and 28, using different chemistries appropriate for each material, as should be understood by those of ordinary skill in the art. In embodiments, the deep trench 40 stops in the regions 21a, 21b of the BJT region 100.

Figure 5:
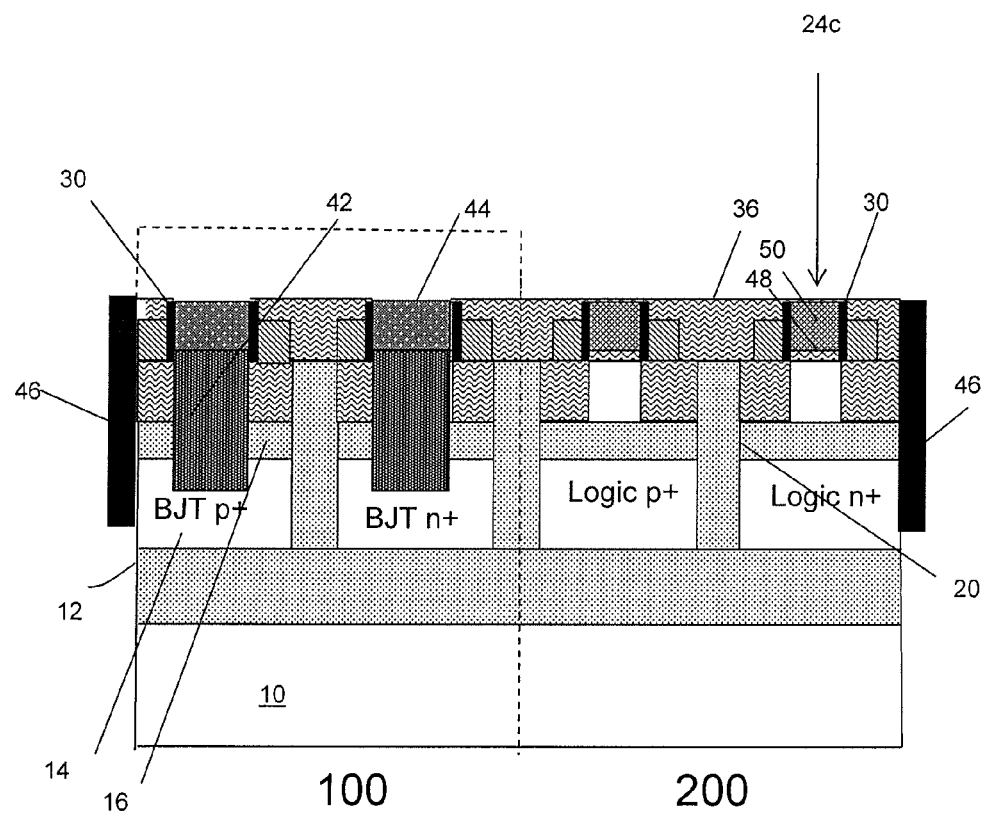

In FIG. 5, an epitaxial material 42 is formed in the deep trench, contacting a respective region 21a, 21b. In embodiments, the epitaxial material 42 is formed by an in situ doped epitaxial growth process, to form a BJT base region. In embodiments, multi epitaxial growth processes can be performed in order to provide a grading doping profile. For example, in embodiments, it is contemplated by the present invention to grow an undoped epitaxial layer, followed by an in situ grown doped epitaxial layer. It should be understood by those of skill in the art that the dimensions of the trench (as formed directly from the aspect ratio of the structure 24a) will prevent pinch off in the trench during the formation of the material 42.

It should be understood by those of ordinary skill in the art that the epitaxial material 42 will be a doped material, which forms a BJT base. Also, the dopant type of the material 42 and deposition processing will depend on the diffusion type (n+ or p+) of the regions 21a, 21b. For example, the material 42 will be a p+ type material, when either or both of the regions 21a, 21b are n+ regions; whereas, the material 42 will be a n+ type material, when either or both of the regions 21a, 21b are p+ regions. It should also be understood by those of skill in the art, that a masking step will be performed for n+ regions, during p+ epitaxial growth and vice versa. However, if all BJT structures are to be the same, e.g., pnp or npn vertically aligned BJT structures, the masking step can be eliminated.

Still referring to FIG. 5, an emitter contact region 44 is formed in the trench and on the material 42. In embodiments, the emitter contact region 44 will have an opposite dopant type than the material 42. For example, the emitter contact region 44 will have a p+ dopant, when the material 42 has an n+ dopant and the region 21a and/or 21b has a p+ dopant. In this way, the BJT device will be a pnp vertical device. Similarly, the emitter contact region 44 will have an n+ dopant, when the material 42 has an p+ dopant and the region 21a and/or 21b has a n+ dopant. In this way, the BJT device will be an npn vertical device.

In embodiments, the emitter contact region 44 can be formed by an in situ grown doped epitaxial layer. In alternative embodiments, the emitter contact region 44 can be undoped, and then implanted at a later process step. In embodiments, a logic spike anneal will drive poly dopant into the epitaxial material to form the BJT emitter contact region 44. Also, as should now be understood by those of skill in the art, both the base region 42 and emitter contact 44 are formed in a single trench structure. This being the case, the base region 42 and emitter contact 44 are completely vertically aligned, and will have a same cross sectional dimension.

The mask 36 can then undergo a planarization process, e.g., chemical mechanical polishing (CMP), in order for the structure to have a planar surface. This allows additional processing to be performed on the structure, e.g., back end of the line (BEOL) structures, metal gates in the logic region, dielectric layers, contacts, etc. In additional aspects of the present invention, contacts 46 are formed to contact the diffusion regions 21a, 21b, 21c, 21d. The contacts can be, for example, doped poly material, formed in a trench. The trench can be formed using any conventional etching process.

More specifically, the mask 36 can be planarized on the side of the logic region 200 in order to access the sacrificial gate structures, and another blocking mask (shown as phantom lines) can be formed over the BJT region 100. Thereafter, the sacrificial oxide material and the sacrificial poly material (forming the sacrificial gate structure 24b) can be removed, using conventional etchants selective to the sacrificial oxide material and the sacrificial poly material, in a single tool or multiple tools. This removal process will form a trench between the spacers 30. Thereafter, a high-k dielectric material 48 such as $HfO_2$ can be deposited in the trench between the spacers 30, using conventional deposition methods such as CVD. A metal material or combination of metals and poly material 50 can be deposited on the high-k dielectric material 48 (also deposited in the trench between the spacers 30). In this way, a metal gate 24c can be formed in the logic region 200. Thereafter, the blocking mask can be planarized with any excess metal, insulator and/or poly material, to form the structure of FIG. 5.

In an alternative process, the present invention also contemplates a gate first process. For example, reverting back to FIG. 2, in a gate first process, the sacrificial structures 24a and gate structures 24b can be formed in the same processing steps or in different processing steps. For example, an insulator layer 26, e.g., high-k dielectric material such as $HfO_2$, can be deposited on the layer 18 using conventional deposition methods such as CVD. A metal or combination of metals and poly material 28 can be deposited on the insulator layer 26. The insulator layer 26 and the material 28 are then patterned to form the sacrificial structures 24a and gate structures 24b. The patterning is performed by conventional CMOS processes, i.e., photolithographic and etching. Sidewall spacers 30 are then formed on the sidewalls of the sacrificial structures 24a and gate structures 24b. The sidewall spacers 30 can be oxide, for example, deposited or grown, using conventional processes. In embodiments, the sidewall spacers 30 can also be nitride. Thereafter, source and drain regions 32 are formed using conventional dopants and processes, such that further explanation is not required herein for an understanding of the invention. Processing continues as described herein, with the exception of removing any gate structures in FIG. 5.

In still another alternative process, in a gate first process, the sacrificial structures 24a and gate structures 24b can be formed in different processing steps. For example, an insulator layer, e.g., oxide, and a poly material can be deposited and patterned to form the sacrificial structures 24. These structures can then be masked, to form the gate structures 24b. The gate structures 24b can be formed by depositing the high-k dielectric material, metal or combination of metals and poly material and then patterning these materials. The mask can then be removed, and sidewall spacers 30 are then formed on the sidewalls of the sacrificial structures 24a and gate structures 24b. The above processes can also be performed in reverse order, e.g., forming the gate structure and then the sacrificial structure. Thereafter, source and drain regions 32 are formed using conventional dopants and processes.

Figure 6:
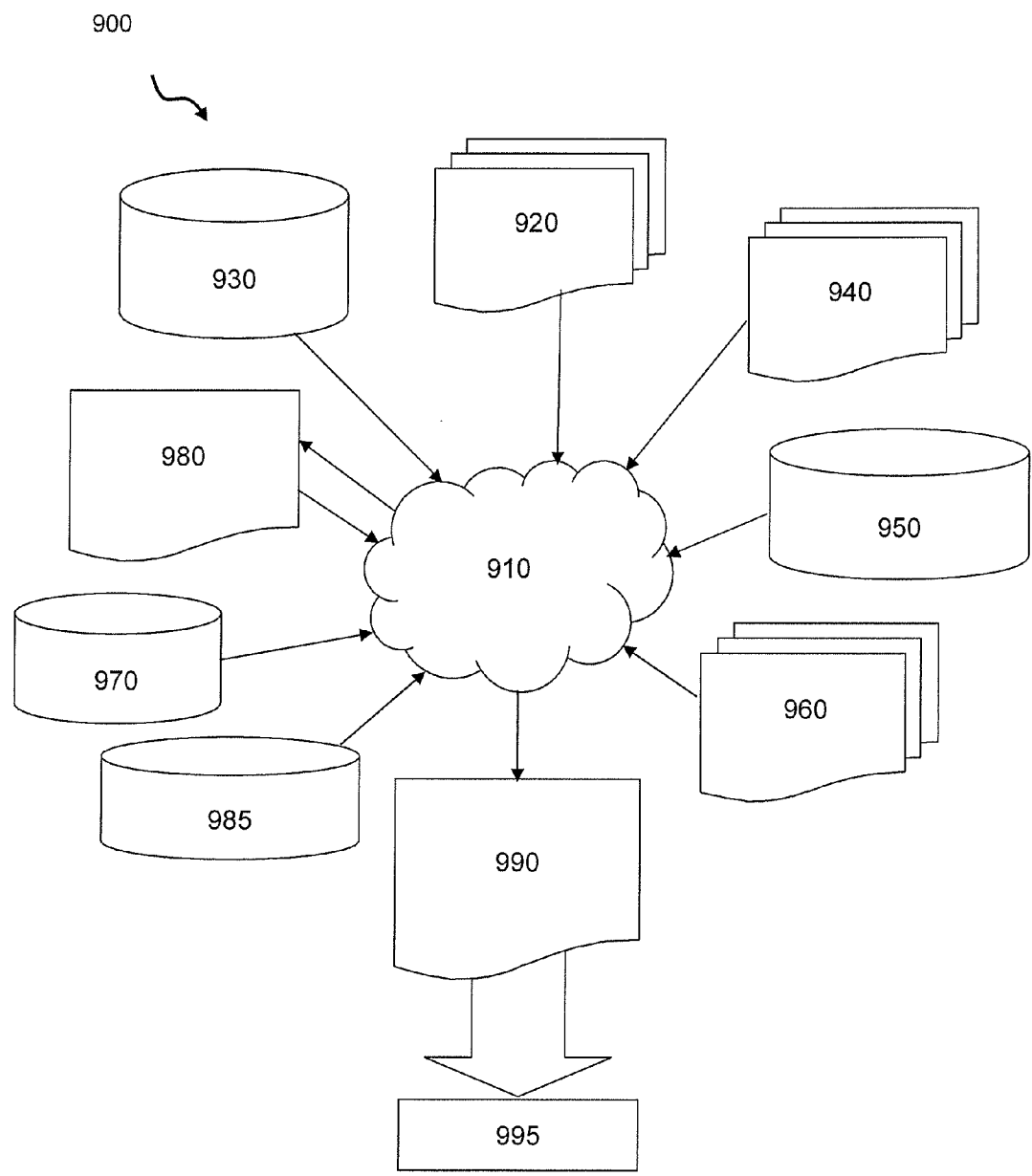
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: photolithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming one or more sacrificial structures for a bipolar junction transistor (BJT) in a first region of a chip, over respective diffusion regions;
    forming a mask over the one or more sacrificial structures;
    etching an opening in the mask, aligned with the one or more sacrificial structures;
    forming a trench through the opening and extending into diffusion regions below the one or more sacrificial structures;
    forming a base region of the BJT by depositing an epitaxial material in the trench, in contact with the diffusion regions; and
    forming an emitter contact of the BJT by depositing a second epitaxial material on the base region within the trench, the epitaxial material for the emitter region being of an opposite dopant type than the epitaxial material of the base region.

2. The method of claim 1, wherein the diffusion regions under the one or more sacrificial structures are at least one of n+ regions and p+ regions formed by a deep implantation process.

3. The method of claim 2, wherein:
    the diffusion regions are p+ regions;
    the base region of the BJT includes an n+ doped material; and
    the emitter contact of the BJT includes a p+ doped material.

4. The method of claim 2, wherein:
    the diffusion regions are n+ regions;
    the base region of the BJT includes a p+ doped material; and
    the emitter contact of the BJT includes an n+ doped material.

5. The method of claim 1, wherein:
    at least one diffusion region under the one or more sacrificial structures is an n+ region formed by a deep implantation process, wherein:
    the base region of the BJT which contacts the n+ region is a p+ doped material; and
    the emitter contact of the BJT which contacts the p+ doped material of the base region includes an n+ doped material; and
    at least another diffusion region under the one or more sacrificial structures is a p+ region formed by a deep implantation process; wherein:
    the base region of the BJT which contacts the p+ region is an n+ doped material; and
    the emitter contact of the BJT which contacts the n+ doped material of the base region includes a p+ doped material.

6. The method of claim 1, wherein the epitaxial material of the base region is formed by growing an epitaxial doped poly material.

7. The method of claim 6, wherein the epitaxial material of the base region is formed by a multi-epitaxial growth process to provide a grading doping profile.

8. The method of claim 7, wherein the multi-epitaxial growth process comprises growing an undoped epitaxial layer, followed by an in situ grown doped epitaxial layer.

9. The method of claim 1, wherein the emitter contact is formed by an in situ grown doped epitaxial layer.

10. The method of claim 1, wherein the emitter contact is deposited as an undoped epitaxial layer, and implanted at a later process step.

11. The method of claim 1, further comprising forming one or more gate structures for logic in a second region of the chip, wherein:
    the mask is over the one or more sacrificial structures and the one or more gate structures; and
    the one or more sacrificial structures and the one or more gate structures are formed simultaneously by CMOS processes.

12. The method of claim 11, wherein the one or more sacrificial structures are formed larger in dimension than the one or more gate structures.

13. The method of claim 1, wherein the BJT is formed in a dual BOX silicon on insulator (SOI) structure with an ultra thin SOI layer.

14. The method of claim 1, wherein the BJT is formed in a single BOX silicon on insulator (SOI) structure using junction isolation in a substrate.

15. The method of claim 1, wherein a logic spike anneal drives poly dopant into the epitaxial material to form the emitter contact.

16. A method in a computer-aided design system for generating a functional design model of a self-aligned vertical bipolar junction (BJT) structure, the method comprising:
    generating a functional representation of a vertically aligned bipolar junction transistor (BJT) comprising at least one diffusion region of a first dopant type, and a base region and emitter region formed in a single trench structure aligned with the at least one diffusion region, wherein the base region and the emitter region are of different dopant types and have a same cross sectional dimension in vertical alignment with one another.

17. The method of claim 1, wherein the mask undergoes a planarization process to form a planar surface with the base region and the emitter contact.

* * * * *